United States Patent

Butaye et al.

(10) Patent No.: US 11,336,321 B1
(45) Date of Patent: May 17, 2022

(54) TRANSMITTER / RECEIVER DEVICE

(71) Applicants: STMicroelectronics (Grenoble 2) SAS, Grenoble (FR); STMicroelectronics SA, Montrouge (FR)

(72) Inventors: Benoit Butaye, Meylan (FR); Thierry Lapergue, Fontaine (FR)

(73) Assignees: STMicroelectronics SA, Montrouge (FR); STMicroelectronics (Grenoble 2) SAS, Grenoble (FR)

(*) Notice: Subject to any disclaimer, the term of this patent is extended or adjusted under 35 U.S.C. 154(b) by 0 days.

(21) Appl. No.: 16/951,669

(22) Filed: Nov. 18, 2020

(30) Foreign Application Priority Data

Nov. 9, 2020 (FR) .................................. 2011477

(51) Int. Cl.
*H04B 1/44* (2006.01)
*H03F 3/19* (2006.01)

(52) U.S. Cl.
CPC .............. *H04B 1/44* (2013.01); *H03F 3/19* (2013.01); *H03F 2200/451* (2013.01)

(58) Field of Classification Search
CPC ........ H04B 1/44; H03F 3/19; H03F 2200/451
See application file for complete search history.

(56) References Cited

U.S. PATENT DOCUMENTS

| 5,729,572 A | 3/1998 | Oh | |
|---|---|---|---|
| 10,419,060 B1* | 9/2019 | Lin | ................ H04B 1/48 |
| 2002/0094840 A1* | 7/2002 | Hattori | ............... H04B 1/3816 455/558 |
| 2005/0208901 A1* | 9/2005 | Chiu | ..................... H04B 1/18 455/78 |
| 2009/0036065 A1* | 2/2009 | Siu | ..................... H03F 1/223 455/78 |
| 2009/0137218 A1* | 5/2009 | Honda | ................. H04B 1/44 455/127.1 |
| 2009/0289721 A1* | 11/2009 | Rajendran | ............. H03F 3/72 330/301 |
| 2011/0319042 A1 | 12/2011 | Soman | |
| 2016/0028432 A1 | 1/2016 | Zhang et al. | |
| 2018/0048271 A1* | 2/2018 | Patel | .................... H03F 3/19 |
| 2021/0218373 A1* | 7/2021 | Jain | .................. H03F 3/45475 |

FOREIGN PATENT DOCUMENTS

| GB | 2504488 A | 2/2014 |
|---|---|---|
| WO | 2020161194 A1 | 8/2020 |

* cited by examiner

*Primary Examiner* — Nguyen T Vo
(74) *Attorney, Agent, or Firm* — Slater Matsil, LLP

(57) ABSTRACT

A transmitter/receiver device include an antenna, a voltage source, a radio frequency receiver connected to the antenna and powered by the voltage source, a radio frequency transmitter connected to the antenna and powered by the voltage source, and a switch coupled to the antenna, the receiver and the transmitter and configured to couple/decouple the antenna from the transmitter or from the receiver. The antenna is shared between the transmitter and the receiver. The receiver includes a radio frequency stage that includes an amplifier device having an input coupled to the antenna. The amplifier device includes an amplifier switch configured to connect or disconnect the amplifier device from the voltage source.

22 Claims, 5 Drawing Sheets

TRANSMITTER / RECEIVER DEVICE

CROSS-REFERENCE TO RELATED APPLICATIONS

This application claims priority to French Patent Application No. 2011477, filed on Nov. 9, 2020.

TECHNICAL FIELD

The invention relates to the emission and the reception of signals, for example satellite signals, via an emitter/receiver device, the receiver and the emitter of which share the same antenna. The invention relates more particularly to the radio frequency stage of the receiver connected to the antenna.

BACKGROUND

An emitter/receiver device conventionally comprises an emitter and a receiver connected to the same antenna.

The receiver comprises in particular a radio frequency stage allowing to amplify and shape the signal received by the antenna and comprises for this purpose several electronic components. The radio frequency stage is conventionally connected to a digital processing stage via an analogue-digital converter. Elements ensuring the inverse functions are present in the receiver.

When the antenna is shared between the receiver and the emitter, the emitter must not disturb the receiver so that the antenna is conventionally decoupled from the emitter when the device emits and vice versa. Indeed, the emitter induces high loads towards the receiver and vice versa.

However, this decoupling is not sufficient and the emitter can disturb the functioning of the receiver and the latter can despite all this receive signals that can have a negative effect on its operation. Indeed, the receiver can receive signals causing large variations in voltage in particular on the input components. Thus, components can be damaged by the parasite signals.

There is therefore a need to protect the receiver when the emitter emits a signal.

SUMMARY

The invention proposes overcoming at least one of these disadvantages.

For this purpose, the invention proposes an emitter/receiver device comprising: an antenna, a source of voltage, a radio frequency receiver powered by the source of voltage, a radio frequency emitter powered by the source of voltage, the emitter and the receiver being connected to an antenna, the antenna being shared between the emitter and the receiver, the device comprising means for coupling/decoupling the antenna from the emitter or from the receiver, said receiver comprising a radio frequency stage, said radio frequency stage comprising at least one amplifier device, said amplifier device comprising an input for receiving a radio frequency signal coming from the antenna and an output for providing an output signal that corresponds to the amplified input radio signal, said amplifier device comprises means configured to connect or disconnect said amplifier device from the source of voltage.

The invention is advantageously completed by the following features, taken alone or in any one of their technically possible combinations:

the means configured to connect or disconnect said amplifier device from the source of voltage consist of one or more switches;
the device comprises a first stage comprising the input and a second stage comprising the output;
the input is a simple or differential input comprising, preferably, a balun;
said first and second stages are coupled via a balun;
said first and second stages are coupled via a capacitor;
said first and second stages are coupled via a transformer;
the first stage comprises a series mounting of two transistors, the base of one transistor being connected to the input, the base of the other being connected to the source of voltage;
the series mountings of two transistors are cascode mountings.

BRIEF DESCRIPTION OF THE DRAWINGS

Other features, goals and advantages of the invention will be clear from the following description, which is purely illustrative and non-limiting, and which must be read in reference to the appended drawings in which.

In all of the drawings, similar elements carry identical references.

DETAILED DESCRIPTION OF ILLUSTRATIVE EMBODIMENTS

Figure 1:
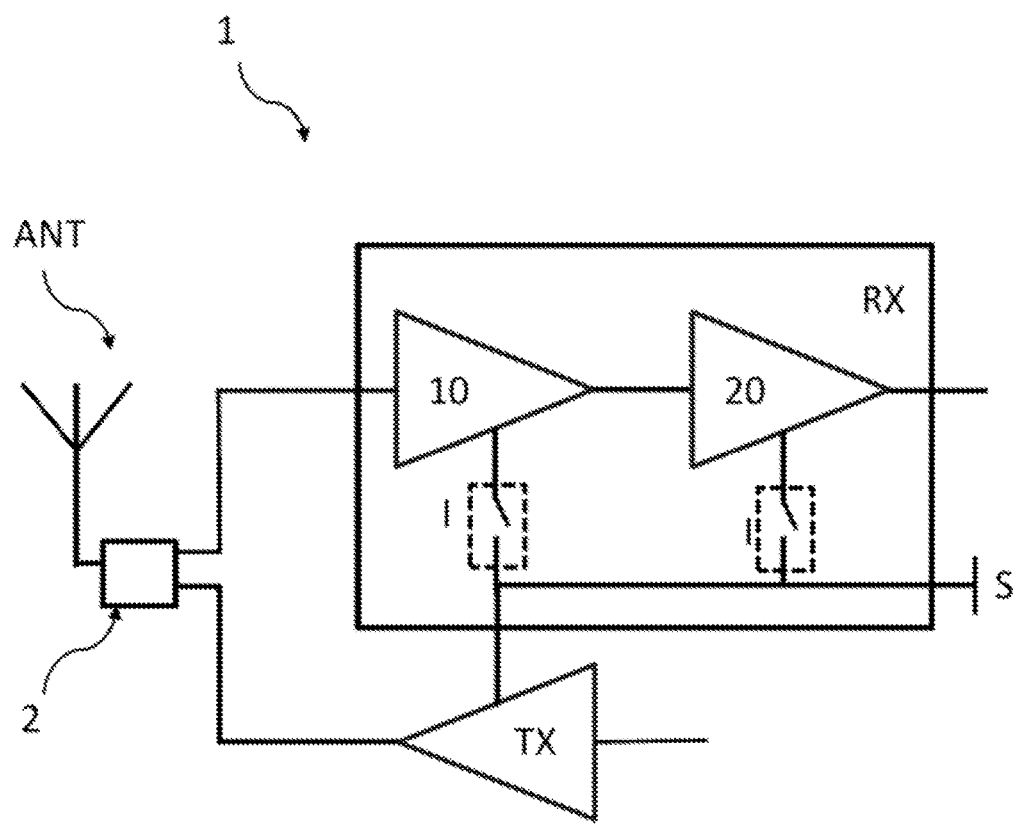
FIG. 1 illustrates an emitter/receiver device according to the invention.

FIG. 1 illustrates an emitter/receiver device 1 comprising an emitter RX and a receiver TX both connected to an antenna ANT.

The emitter RX and the receiver TX are powered by a shared source of voltage S. This shared source of voltage S powers all the electronic components of the device 1 for reasons of bulk in particular.

Moreover, to couple the antenna ANT to the receiver RX or to the emitter TX, the device 1 comprises means 2 for coupling the antenna ANT to the emitter TX and to the receiver RX. These coupling means can for example be a switch which switches from the emitter to the receiver and vice versa.

In a manner known per se, and as mentioned above, the receiver RX comprises a radio frequency stage comprising an amplifier device comprising one or more low-noise amplifiers 10, 20. These low-noise amplifiers allow to amplify the radio signals coming from the antenna ANT before the downstream processing, in particular digital.

Figure 2A:
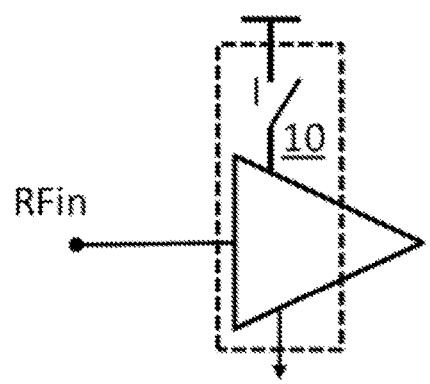
FIGS. 2A and 2B illustrate an amplifier device according to various embodiments.
Figure 2B:
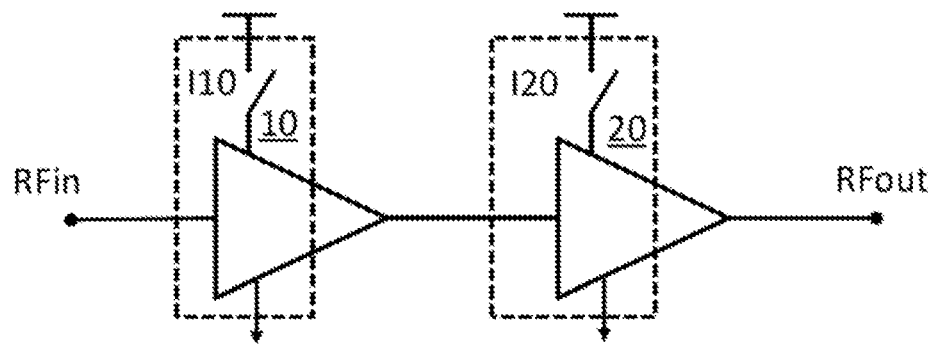

FIG. 2A illustrates a receiver comprising an amplifier device comprising a stage 10 and FIG. 2B illustrates an amplifier device comprising two stages 10, 20.

Besides the fact of being able to decouple the antenna from the receiver RX, the device 1 further comprises means I10, I20, I configured to connect or disconnect each stage from the power supply source S. It should be noted that here, this involves disconnecting only the power supply S of the amplifier device that is located directly after the antenna ANT of the emitter/receiver device in the receiver RX part, the other downstream components still being connected to the source S. This disconnection must occur when the device 1 is in emission of a signal and only concerns the receiver RX, and the emitter TX must still be powered via the source S.

Figure 3:
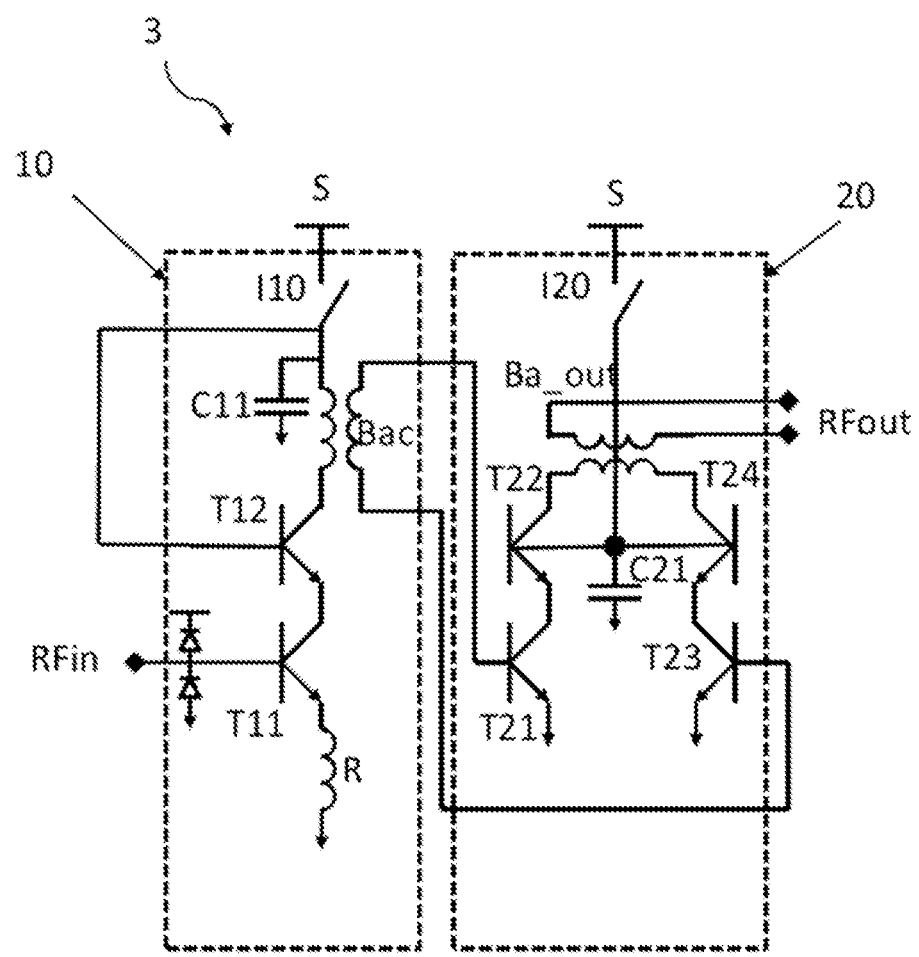
FIGS. 3 to 8 illustrate architectures of an amplifier device according to various embodiments of the invention.

FIG. 3 illustrates a low-noise amplifier (LNA) device with two stages 10, 20 according to one possible embodiment. In all the embodiments described here the transistors are bipolar or of the MOS type.

Such an amplifier device 3 comprises a first stage 10 and a second stage 20.

The first stage 10 comprises an input RFin configured to receive a radio frequency signal coming from the antenna ANT connected to a first transistor T11, the emitter of which is connected to a resistance R connected to the ground. The input RFin is "simple" but can be differential (see below).

A second transistor T12 is connected in series with the first transistor T1, the emitter of the second transistor T12 being connected to the collector of the first transistor Tn.

With the second transistor T12, the first transistor T11 can optionally form a cascode mounting. The second transistor T12 is in this architecture of FIG. 3 connected to the source S but can be connected otherwise.

A first balun Bac couples the first stage 10 to the second stage 20 while being connected to two mountings of transistors in series: one formed by a third and a fourth transistors T21, T22, the other formed by a fifth and a sixth transistors T23, T24. The emitters of the third T21 and fifth T23 transistors are connected to the ground.

These series mountings can be cascode mountings.

These series mountings are connected to the primary of a second balun B_out, the terminals of the secondary of the second balun Ba_out providing the output of the amplifier device.

The output RFout is a differential output and is formed by the balun Ba_out. Here the balun Ba_out is used to obtain a differential output.

The device 3 comprises a power supply source S connected to the two stages. In particular, it is connected to a terminal of the primary of the first balun Bac of the first stage and to the bases of the fourth and sixth transistors of the first stage 10.

In order for the amplifier device to not be powered, means I10, I20 for disconnecting the power supply source S are interposed between the source and the terminals of the primary of the first balun Bac of the first stage and at the bases of the fourth and sixth transistors of the second stage 20.

These means I10, I20 can consist of a controllable switch. Other means are possible.

Each stage further comprises a capacitor C11, C21 connected to the ground which allows to decouple the power supply.

Advantageously, it is both stages that are not powered when the emitter/receiver device is in emission mode. Better performance of the emitter/receiver device is thus obtained and the circuit is protected from destruction while preserving its performance.

Figure 4:
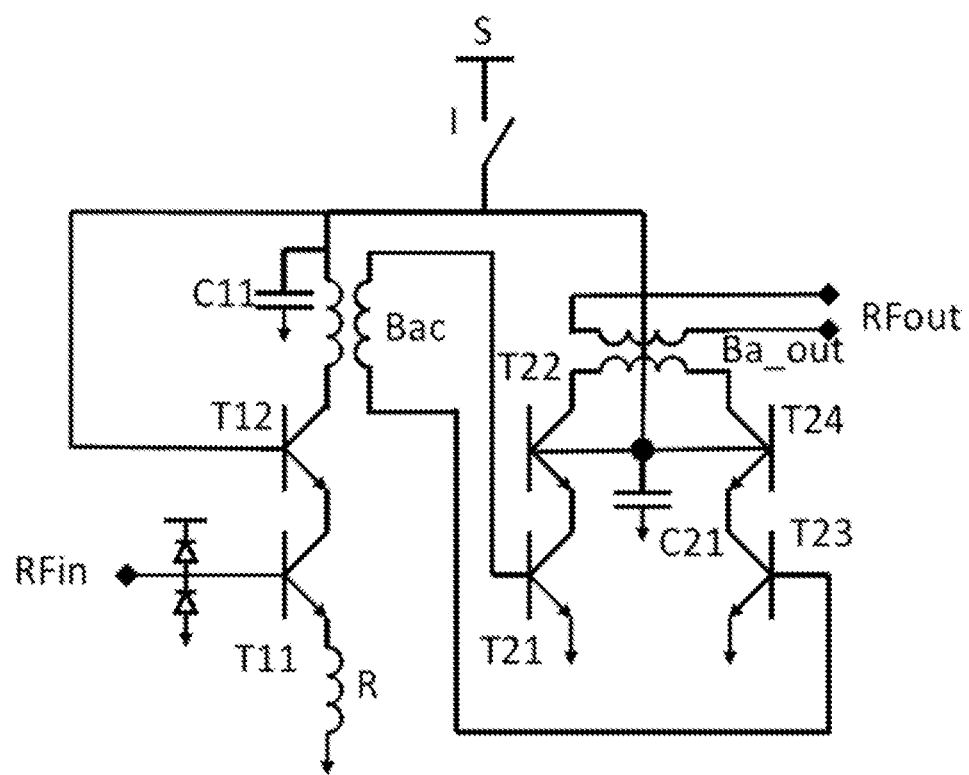

FIG. 4 illustrates the same architecture as FIG. 3 with the difference that a single disconnection means I allows to disconnect the device from the source of power supply.

Alternatively, the input RFin or the output RFout can be differential, and thus comprises two terminals, one optionally connected to the ground. In the case of the differential input or output, the latter is formed by a balun.

Likewise, the input RFin or the output RFout can be simple like the input in FIG. 3.

Figure 5:
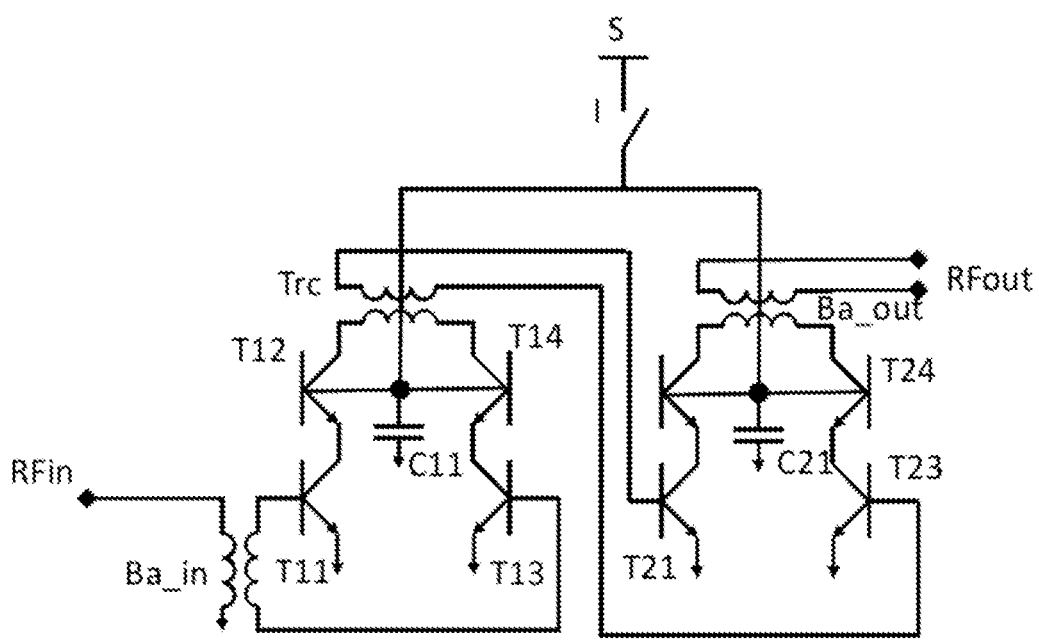

FIG. 5 illustrates a low-noise amplifier device according to another embodiment, comprising two stages and the input RFin and the output RFout of which are differential.

According to this embodiment, the two stages are coupled by a transformer Trc and are perfectly symmetrical here (see description of the stage 20 of FIG. 3). Here again, a single disconnection means I is present but there could be a disconnection means per stage. The couple here is carried out by a transformer Trc and not a balun since the stages are respectively with a differential input and output, the signal remaining differential between the two stages.

Figure 6:
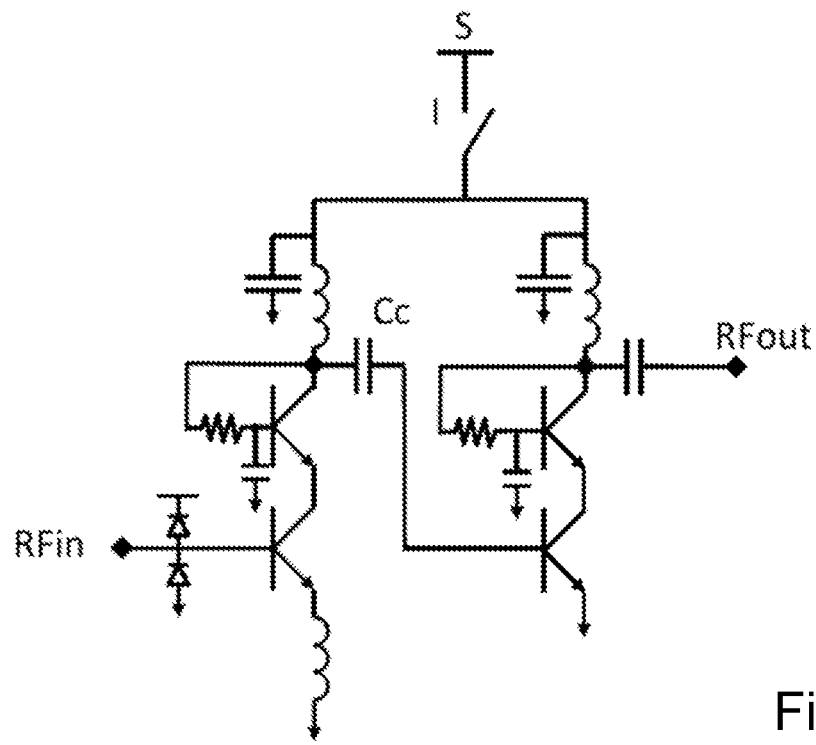

FIG. 6 illustrates a low-noise amplifier device, according to another embodiment, comprising two stages, the input RFin of which is simple while the output RFout is differential (formed by a balun Ba_out). In this drawing, the two stages are coupled via a capacitor Cc. Moreover, a single disconnection means is present (one per stage being possible). The notable difference here is that the coupling between the two stages is carried out via a capacitor.

Figure 7:
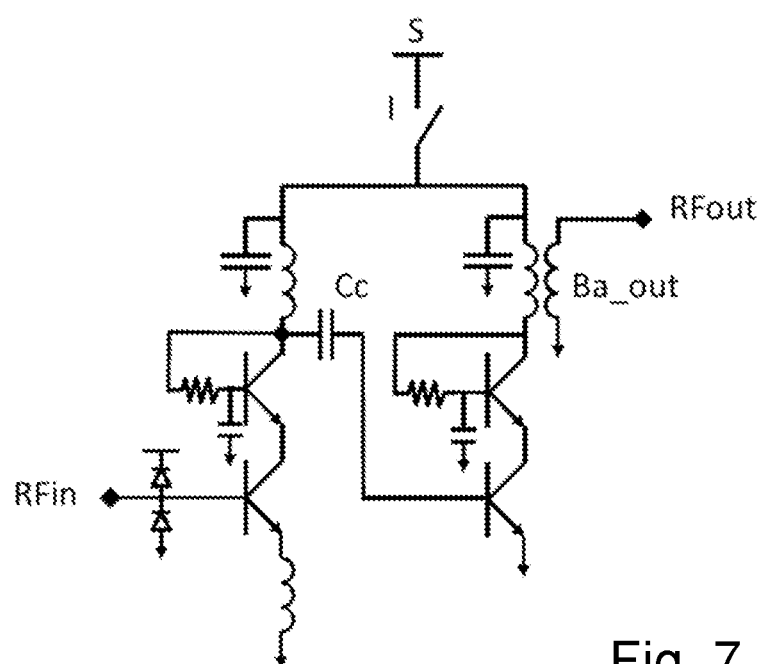

FIG. 7 illustrates a low-noise amplifier device, according to another embodiment, which differs from that of FIG. 6 in that the input and the output are simple.

Figure 8:
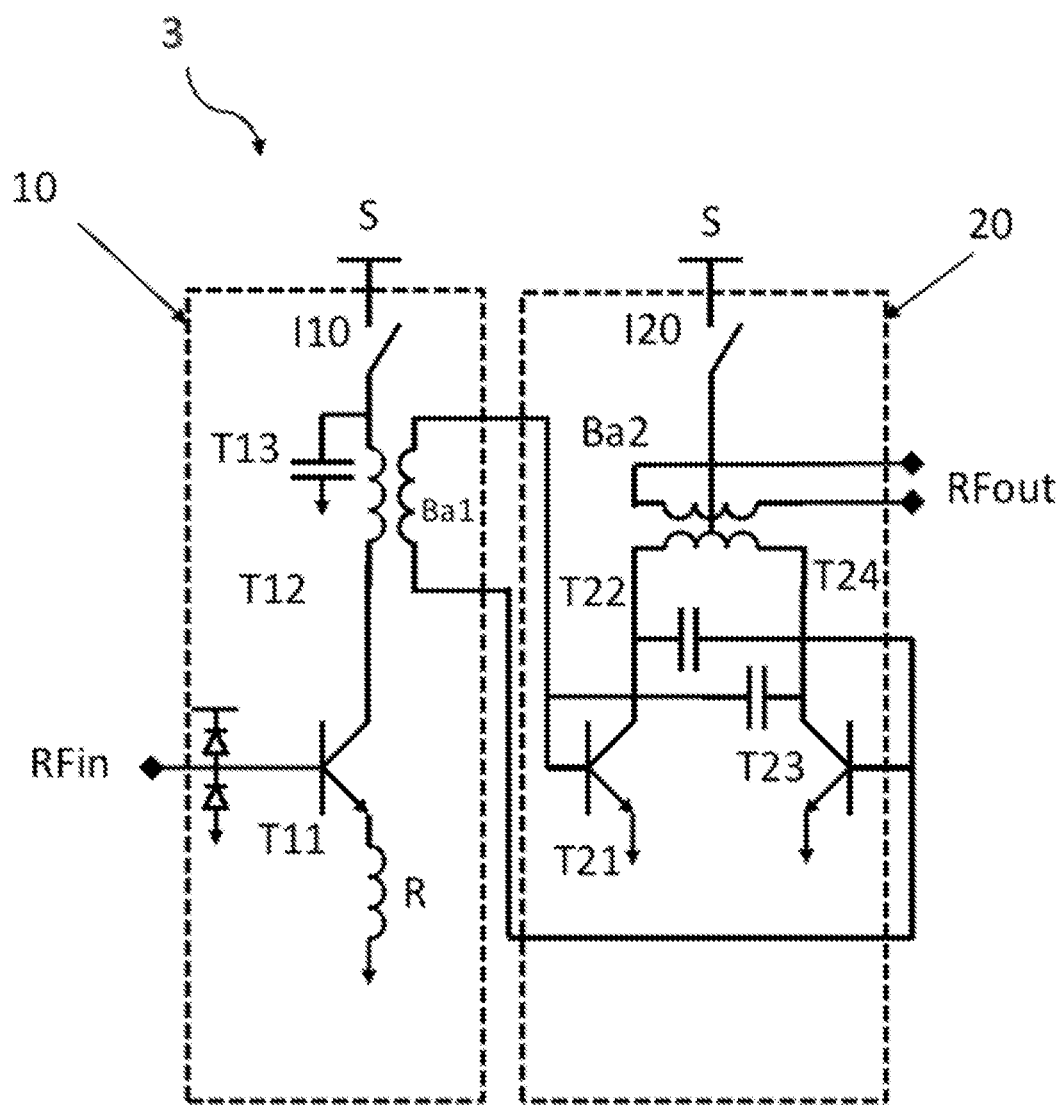

FIG. 8 illustrates a low-noise amplifier device, according to yet another embodiment, which differs from the embodiment of FIG. 3 in that it does not comprise a cascode structure.

In summary, the following possibilities for each of the main elements of the low-noise amplifier are possible, and these possibilities can be combined together:

Input RFin: simple, simple comprising a coil or differential comprising a balun;

Output RFout: simple, simple comprising a coil or differential comprising a balun;

Disconnection means: one per stage, a single one for all the stages;

Coupling of the two stages: transformer, balun or capacitor.

The invention claimed is:

1. A transmitter/receiver device comprising:
an antenna;
a voltage source;
a radio frequency receiver connected to the antenna and powered by the voltage source, the receiver comprising a radio frequency stage that comprises an amplifier device having an input coupled to the antenna, wherein the amplifier device comprises:
an amplifier switch configured to connect or disconnect the amplifier device from the voltage source,
a first transistor having a current path coupled to the amplifier switch, and a control terminal coupled to the input of the amplifier device, and
an inductive element coupled between the amplifier switch and the current path of the first transistor;
a radio frequency transmitter connected to the antenna and powered by the voltage source, the antenna being shared between the transmitter and the receiver; and
a switch coupled to the antenna, the receiver and the transmitter and configured to couple/decouple the antenna from the transmitter or from the receiver.

2. The device according to claim 1, wherein the amplifier switch comprises a plurality of switches.

3. The device according to claim 1, wherein the input of the amplifier device is a singled-ended input.

4. The device according to claim 1, wherein the input of the amplifier device is a differential input.

5. The device according to claim 1, wherein the receiver comprises a first stage having the input of the amplifier device and a second stage comprising an output.

6. The device according to claim 5, wherein the first and second stages are coupled via a balun that comprises primary and secondary windings, wherein the primary winding of the balun corresponds to the inductive element.

7. The device according to claim 6, wherein the second stage of the amplifier device comprises:
   a first pair of transistors having respective control terminals respectively coupled to first and second terminals of the secondary winding of the balun;
   a second pair of transistors having respective current paths respectively coupled to current paths of the first pair of transistors, and further coupled to the output of the second stage via a further balun; and
   a further amplifier switch coupled between the voltage source and control terminals of the second pair of transistors.

8. The device according to claim 6, wherein the second stage of the amplifier device comprises:
   a first pair of transistors having respective control terminals respectively coupled to first and second terminals of the secondary winding of the balun; and
   a second pair of transistors having respective current paths respectively coupled to current paths of the first pair of transistors, and further coupled to the output of the second stage via a further balun, wherein the amplifier switch is coupled between the voltage source and control terminals of the second pair of transistors.

9. The device according to claim 5, wherein the first and second stages are coupled via a capacitor.

10. The device according to claim 9, wherein the second stage of the amplifier device comprises:
    a second transistor having a control terminal coupled to the capacitor;
    a third transistor having a current path coupled in series with a current path of the second transistor; and
    a further inductive element coupled between the amplifier switch and the current path of the third transistor.

11. The device according to claim 1, wherein the amplifier device comprises a second transistor having a current path coupled in series with the current path of the first transistor, the second transistor having a control terminal coupled to the voltage source.

12. The device according to claim 11, wherein the first and second transistors are coupled in a cascode arrangement.

13. A transmitter/receiver device comprising:
    an antenna;
    a voltage source;
    a radio frequency receiver connected to the antenna and powered by the voltage source, the receiver comprising a radio frequency stage that comprises an amplifier device having an input coupled to receive a radio frequency signal from the antenna and an output coupled to provide an output signal that corresponds to an amplified input radio signal, wherein the amplifier device comprises:
      means for connecting and disconnecting the amplifier device from the voltage source,
      a first stage comprising the input of the amplifier device,
      a second stage comprising the output of the amplifier device, and
      a transformer coupling the first and second stages, wherein the second stage comprises a first pair of transistors having respective control terminals respectively coupled to first and second terminals of a secondary winding of the transformer, and a second pair of transistors having respective current paths respectively coupled to current paths of the first pair of transistors, and further coupled to the output of the amplifier device, and wherein control terminals of the second pair of transistors are coupled to the means for connecting and disconnecting the amplifier device from the voltage source;
    a radio frequency transmitter connected to the antenna and powered by the voltage source, the antenna being shared between the transmitter and the receiver; and
    means for coupling/decoupling the antenna from the transmitter or from the receiver.

14. The device according to claim 13, wherein the means for connecting and disconnecting the amplifier device from the voltage source comprises one or more switches.

15. The device according to claim 13, wherein the input of the amplifier device comprises a balun.

16. A method of operating a transmitter/receiver device, the method comprising:
    coupling an antenna to a receiver;
    receiving an incoming signal at the antenna;
    amplifying the incoming signal at an amplifier of the receiver, the amplifier being powered by a voltage source and comprising:
      a switch for connecting and disconnecting the amplifier from the voltage source,
      a first transistor having a current path coupled to the switch, and a control terminal coupled to an input of the amplifier, and
      an inductive element coupled between the switch and the current path of the first transistor;
    decoupling the antenna from the receiver and coupling the antenna to a transmitter;
    disconnecting the amplifier from the voltage source by opening the switch; and
    transmitting an outgoing signal from the transmitter via the antenna, the transmitting being performed while the amplifier is disconnected from the voltage source.

17. The method of claim 16, wherein the amplifier is a first amplifier of a plurality of amplifiers of the receiver, the first amplifier being located directly after the antenna.

18. The method of claim 17, wherein only the first amplifier is disconnected from the voltage source while transmitting the outgoing signal, other amplifier(s) of the plurality remaining connected to the voltage source during the transmitting.

19. The method of claim 16, wherein the transmitter is powered by the voltage source when transmitting the outgoing signal.

20. The method of claim 16, wherein the incoming signal and the outgoing signal are RF signals.

21. The method of claim 16, wherein the incoming signal and the outgoing signal are satellite signals.

22. The method of claim 16, further comprising digitally processing the incoming signal after the amplifying.

* * * * *

UNITED STATES PATENT AND TRADEMARK OFFICE
CERTIFICATE OF CORRECTION

| | | |
|---|---|---|
| PATENT NO. | : 11,336,321 B1 | Page 1 of 1 |
| APPLICATION NO. | : 16/951669 | |
| DATED | : May 17, 2022 | |
| INVENTOR(S) | : Butaye et al. | |

It is certified that error appears in the above-identified patent and that said Letters Patent is hereby corrected as shown below:

On the Title Page

Insert --(65) Prior Publication Data, US 2022-0149886 A1, 05-12-2022--.

Signed and Sealed this
Fifth Day of July, 2022

Katherine Kelly Vidal
*Director of the United States Patent and Trademark Office*